United States Patent [19]

Schlesier et al.

[11] 4,097,314
[45] Jun. 27, 1978

[54] METHOD OF MAKING A SAPPHIRE GATE TRANSISTOR

[75] Inventors: Kenneth Mansfield Schlesier, Stockton; Carl William Benyon, Jr., Trenton; Joseph Michael Shaw, East Windsor Township, Mercer County, all of N.J.

[73] Assignee: RCA Corp., New York, N.Y.

[21] Appl. No.: 755,965

[22] Filed: Dec. 30, 1976

[51] Int. Cl.² ........................................ H01L 21/225
[52] U.S. Cl. .................................. 148/188; 148/1.5; 148/187; 357/42
[58] Field of Search ................... 148/188, 187, 1.5; 357/42

[56] References Cited

U.S. PATENT DOCUMENTS

| | | | |
|---|---|---|---|
| 3,520,722 | 7/1970 | Scott | 148/187 X |
| 3,745,072 | 7/1973 | Scott | 148/175 |
| 3,749,614 | 7/1973 | Boleky et al. | 148/188 |
| 3,837,071 | 9/1974 | Ronen | 148/188 X |
| 3,890,632 | 6/1975 | Ham et al. | 357/23 |
| 3,912,558 | 10/1975 | Luce et al. | 148/187 |
| 3,933,529 | 1/1976 | Goser | 148/1.5 |
| 3,958,266 | 5/1976 | Athanas | 357/42 X |
| 3,974,515 | 8/1976 | Ipri et al. | 357/23 |
| 4,002,501 | 1/1977 | Tamura | 148/1.5 |

*Primary Examiner*—G. Ozaki
*Attorney, Agent, or Firm*—H. Christoffersen; D. S. Cohen; L. P. Benjamin

[57] ABSTRACT

A method of making an improved aluminum oxide (sapphire) gate field effect transistor wherein the capacitance-voltage characteristic of the transistor is improved by annealing the aluminum oxide at a temperature less than the growth temperature of the aluminum oxide. A transistor annealed at a temperature less than the growth temperature is provided wherein the threshold voltage is the same as if the transistor were annealed at a temperature greater than the growth temperature; the capacitance-voltage characteristic of the transistor exhibiting markedly diminished hysteresis by annealing at a temperature less than the growth temperature.

10 Claims, 19 Drawing Figures

METHOD OF MAKING A SAPPHIRE GATE TRANSISTOR

The Government has rights in this invention pursuant to Contract No. F19628-73-C-0146, awarded by the Department of the Air Force.

This invention is related generally to a method wherein a silicon-on-sapphire field effect transistor having an aluminum oxide gate insulator and polycrystalline silicon gate is annealed to diminish instability in the threshold voltage of the transistor. Specifically, the invention relates to an improvement in a known method for annealing an aluminum oxide gate insulator by selecting a particular sequence and set of values for the annealing or heat treating temperatures.

Aluminum oxide has been found useful as a passivation layer on silicon monolithic integrated circuits and as an improved gate insulator in gate field effect transistors. The use of aluminum oxide as the gate insulator for complementary symmetry field effect transistor circuits has resulted in low power, medium to high speed switching, high noise immunity circuits, which are also radiation resistant as a result of the use of the aluminum oxide as the gate insulator. These circuits continue to operate after exposure to radiation which causes failure in similar circuits with silicon dioxide as the gate insulator layers.

In particular, aluminum oxide gate insulators are usually deposited by a pyrohydrolytic reaction of aluminum trichloride vapor with water vapor, and the deposited aluminum oxide is subsequently annealed or heat treated to remove electrical charges which tend to accumulate in the aluminum oxide layer during growth. As known, the teachings of the silicon dioxide insulator art have been presumed to apply to aluminum oxide and that the subsequent heat treating steps have taken place either at the growth temperature of the aluminum oxide or at a temperature greater than the growth temperature of the aluminum oxide in much the same manner as silicon dioxide has been annealed in prior art processes involving silicon technology. See, for example, U.S. Pat. No. 3,766,637, issued to Norris et al., Oct. 23, 1973, wherein the use of aluminum oxide as a gate insulator is taught wherein the aluminum oxide is annealed at the growth temperature.

Hysteresis in the capacitance-voltage characteristic of a silicon-on-sapphire transistor structure or similar structure combining a conductor-insulator-semiconductor for use in an integrated circuit as an enhancement type field effect transistor significantly degrades the current voltage characteristic of the transistor and indicates an instability in the threshold turn-on voltage.

The inventors have discovered that field effect transistors manufactured from islands of epitaxial silicon formed adjacent a sapphire substrate wherein the gate insulator is aluminum oxide and the gate contact is polycrystalline silicon, exhibit an instability in the form of a hysteresis in the capacitance-voltage characteristic wherein the capacitance is measured at various voltages with contacts attached to the polycrystalline silicon contact and the drain. This hysteresis greatly inhibits the production of operable field effect transistors because the threshold voltage of such a transistor is also unstable.

A similar problem with respect to the use of silicon nitride as a gate insulator has been investigated wherein a hysteresis was exhibited. In particular, an interface instability because of the silicon nitride coating being adjacent a silicon dioxide layer and a storage of charge at the interface was eliminated by heating the field transistor in a specific ambient prior to deposition of the silicon nitride. See, for example, U.S. Pat. No. 3,520,722, issued to Joseph H. Scott, Jr. on July 14, 1970. Thus, annealing gate insulators to improve or eliminate hysteresis capacitance-voltage characteristic of a semiconductor composite comprised of a semiconductor having adjacent thereto an insulator with an electrical contact thereon wherein the hysteresis is caused by the interface instability is known.

On the other hand, heretofore, no method for making a device comprising an aluminum oxide gate insulator and polycrystalline contact adjacent the insulator, which would not exhibit hysteresis in the capacitance-voltage characteristic existed.

Briefly, the present invention is a method of processing a silicon-on-sapphire mesa transistor comprising an aluminum oxide gate and polycrystalline silicon gate contact wherein all heat treating or annealing steps subsequent to the growth of the aluminum oxide are specifically selected to occur at temperatures lower than the growth temperature of the aluminum oxide.

IN THE DRAWINGS

In making a pair of P and N channel transistors in accordance with the method of this novel invention, N and P silicon islands 12 and 14 are formed adjacent a sapphire substrate 16 by a known means such as epitaxial deposition and definition using photolithography. First, an epitaxial layer of N-type silicon is formed and appropriately etched into spaced semiconductor islands. Subsequently, epitaxial P-type silicon is deposited in the spaces between the islands of N-type silicon and formed into islands laterally spaced from the N-type islands.

Figure 1:
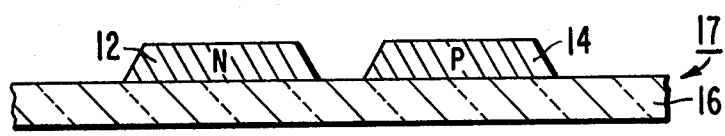
FIGS. 1–14 are cross-sectional views illustrating successive steps in the manufacture of N channel transistors and P channel transistors in accordance with the method of the present invention.
Figure 2:
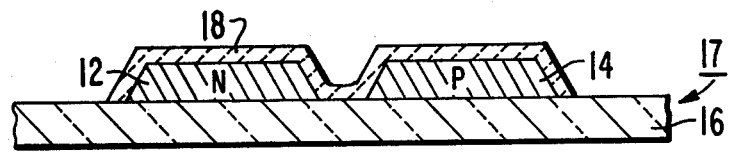

As shown in FIG. 1, the N-silicon island 12 and the P-silicon island 14 generally comprise a wafer 17 which is coated with a layer 18 of aluminum oxide (FIG. 2).

Figure 19:
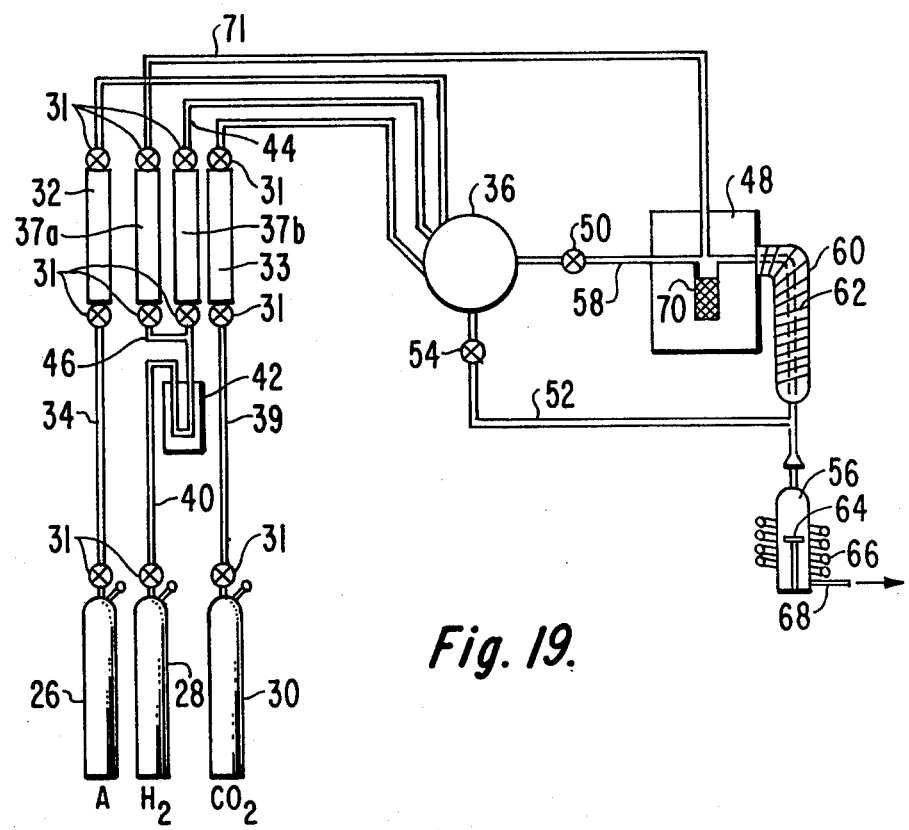
FIG. 19 is a diagram of an apparatus for depositing aluminum oxide.

FIG. 19 is a schematic drawing of apparatus for carrying out the deposition of the $Al_2O_3$ layer 18. The apparatus comprises three gas tanks 26, 28, and 30 containing argon, hydrogen and carbon dioxide, respectively. The tanks 26 and 30 are connected via a valve such as 31 to suitable flowmeters 32 and 33, respectively. The argon tank 26 has a line 34 leading to a mixing chamber 36. The tank 28 is connected via valves 31 to suitable flowmeters 37a and 37b. The carbon dioxide tank 30 also has a line 39 leading directly to the chamber 36. The hydrogen tank 28 has a line 40 leading through a cold trap 42 and then into a branch line 44 leading to the mixing chamber 36 and another branch line 46 leading into a means 48 for sublimating aluminum chloride. A line 52 leads from mixing chamber 36 through a valve 54 to a quartz reaction tube 56. A line 58, containing valve 50, connects the mixing chamber 36 and the sublimator 48.

At the exit side of sublimator 48 is a tube 60 surrounded by a heater 62. The line 60 also leads to the reaction tube 56.

Inside the reaction tube 56 is a pedestal or susceptor 64. Outside reaction tube 56 is a conventional RF heater coil 66 connected to an RF generator (not shown). Leading from the reaction tube 56 is a vent 68.

In carrying out the present improved method of depositing aluminum oxide, the wafer 17 which is at the manufacturing stage shown in FIG. 1, is placed on the pedestal of the susceptor 64 and inserted within the reaction tube 56.

The system is then flushed with argon from the tank 26 for several minutes. The argon passes through line 34 to mixing chamber 36 from which it proceeds through line 58 to the sublimator 48 and thence through line 60 to the reaction tube 56. It also proceeds from the mixing chamber 36 through line 52.

The wafer 17 as shown in FIG. 1 is preferably heated to 975° C by the RF heater coil 66. However, the heating temperature may be varied within a range of about 800° C and 1000° C. With argon gas still flowing, hydrogen is permitted to flow from the tank 28. The hydrogen flow is adjusted to about 2700 cc/min. and the temperature is permitted to stabilize for 5–10 minutes. When the hydrogen flow is established, the argon flow is shut off from the tank 28 via a valve 31.

Meanwhile, aluminum trichloride in solid form is placed within a flask 70 within the sublimator 48 prior to deposition and the flask 70 is heated at a temperature high enough to obtain a sufficient partial pressure of the aluminum trichloride. Aluminum trichloride has a vapor pressure of approximately 10 mm. at a temperature of about 125° C. Hydrogen flowing through the lines 40 and 71 to the sublimator 48 picks up the aluminum trichloride vapor and carries it through the heated tube 60 into the reaction tube 56. The tube 60 is heated so that aluminum trichloride does not condense on its wall before reaching the reaction tube 56. The hydrogen, laden with aluminum trichloride vapor, is adjusted to a flow rate of about 350 cc./min. Hydrogen also flows through line 44 to the mixing chamber 36 where it is mixed with carbon dioxide.

The carbon dioxide flows past a valve 31 through the line 39 through another valve 31 to the mixing chamber 36 and is adjusted to a flow rate of about 20 cc./min.

The chemical reaction which occurs is as follows:

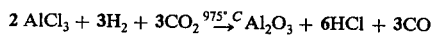

The hydrogen and carbon dioxide react to form water and carbon monoxide, and the water (vapor) reacts with the AlCl$_3$ to form Al$_2$O$_3$ and HCl.

It has been found that there is an incubation period of about 30 seconds before an Al$_2$O$_3$ film begins to deposit on the wafer 17. After about 5–6 minutes, an interference color produced by the growing film becomes visible. A "straw" color indicates a thickness of 400 Angstroms. The film may have any thickness up to about 4000 Angstroms. A growth rate of 75–100 Angstroms per minute is preferably maintained, but this can be more widely varied between about 50 and 125 Angstroms per minute.

When the desired thickness for the Al$_2$O$_3$ layer 18 has been obtained, the deposition is terminated by simultaneously shutting off the AlCl$_3$-hydrogen carrier flow and the CO$_2$ flow by means of selected valves 31.

Next, the Al$_2$O$_3$-coated wafer 17 as shown in FIG. 2 is annealed for about 20 minutes (at least 10 minutes) in hydrogen at the growth temperature of 975° C. The annealing time should not be less than about 10 minutes and can be much longer than 20 minutes, but there is little benefit from using longer times.

Following the annealing step, the wafer 17 is permitted to cool slowly at a temperature decrease of 20°–25° C/min. (or slower) until, after about 20 minutes or so, a temperature of 300°–400° C is reached. The slow cooling takes place in the hydrogen atmosphere. There does not appear to be any additional benefit from cooling at a rate slower than 20° C/min., although a slower rate is not detrimental.

When the temperature has dropped to 300°–400° C, the RF power is turned off and the wafer is allowed to cool more rapidly to room temperature. Argon gas is then substituted for hydrogen by opening selected valves 31 and the wafer is removed from the reaction tube 56 for further processing. The gas line 68 may be used to assist flushing operations.

Further aspects of the above processing steps for the deposition of aluminum oxide onto the substrate 10 may be found in U.S. Pat. No. 3,766,637 issued Oct. 23, 1973 to Norris et al., and such patent is hereby incorporated herein by reference.

Figure 3:
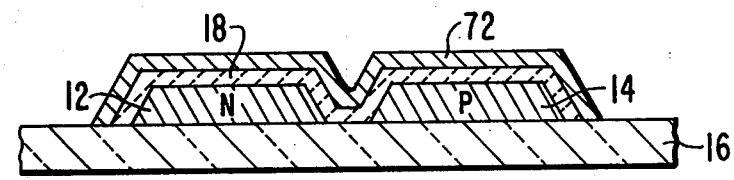
Figure 4:
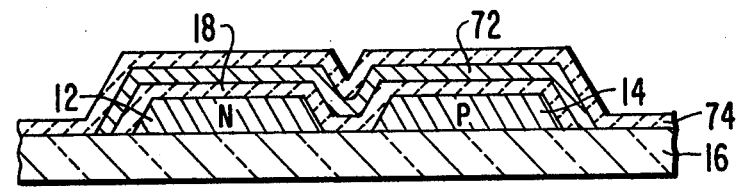
Figure 5:
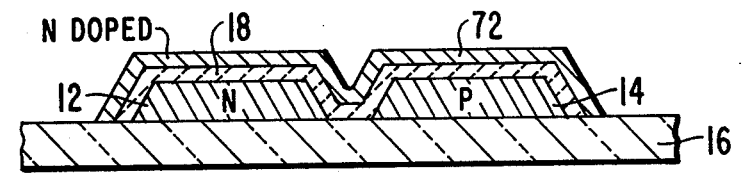
Figure 6:
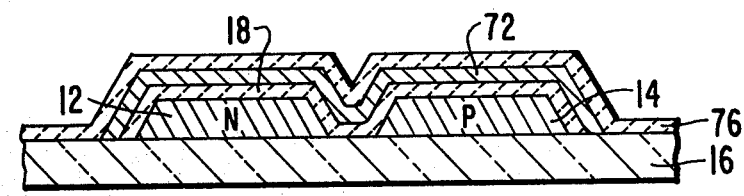

Additional processing includes the deposition of a layer 72 of N-doped polycrystalline silicon adjacent the layer 18 of aluminum oxide (FIG. 3). This polycrystalline silicon layer may be deposited by a known process for pyrolytic decomposition of silane (SiH$_4$) in hydrogen. The polycrystalline layer 72 is doped N by deposition of a phosphorus doped layer 74 of silicon dioxide adjacent thereto as shown in FIG. 4. The silicon dioxide layer 74 may be deposited by a known process for oxidation of silane (SiH$_4$) in wet steam. Subsequently, the phosphorus impurities contained in the silicon dioxide layer 74 are driven into the polycrystalline silicon layer 72 by heating in an air ambient at 950° C for one hour. As shown in FIGS. 4 and 5, the phosphorus doped silicon dioxide layer 74 is removed and the phosphorus doped polycrystalline silicon layer 72 remains adjacent the aluminum oxide layer 18. The phosphorus doped silicon dioxide layer 74 (FIG. 4) is replaced with a clean undoped silicon dioxide layer 76 (FIG. 6) which is used to define a gate pattern from the polycrystalline silicon layer 72 and the aluminum oxide layer 18. This clean layer 76 is formed in the same manner as the previous silicon dioxide layer using a known process for oxidation of silane.

Figure 7:
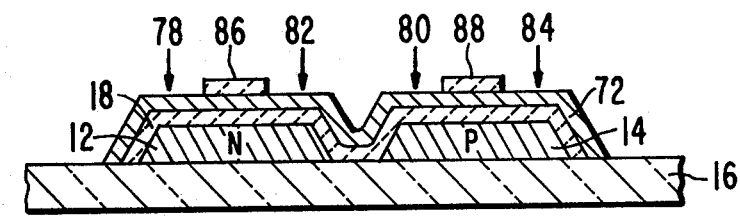
Figure 8:
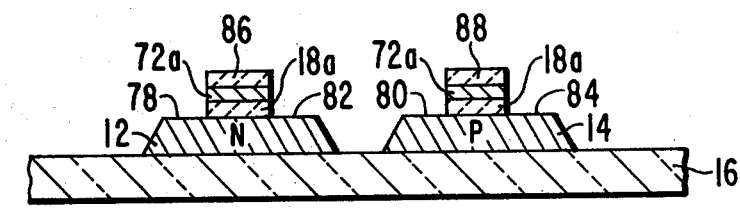

Using a conventional and known photomasking and etching technique, part of silicon dioxide layer 76 is removed from over areas where the source and drain regions 78, 80 and 82, 84, respectively, are to be formed. Using the remaining silicon dioxide portions 86 and 88 as a mask (FIG. 7), the polycrystalline silicon layer 72 and the aluminum oxide layer 18 are removed in the areas not covered by the portions 86 and 88 to expose areas where source and drain regions are to be formed. The resultant structure is shown in FIG. 8 wherein the remaining portions 72a of the polycrystalline layer 72 and the remaining portions 18a of the aluminum oxide layer 18 are located immediately underneath the masking oxide portions 86 and 88.

Figure 9:
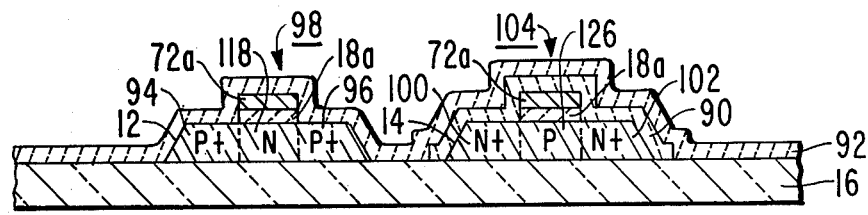

Next, the masking portions 86 and 88 are removed from the structure. Subsequently, a phosphorus doped layer 90 of silicon dioxide is deposited adjacent the P type silicon island 14 and a layer 92 doped with boron, for example, is deposited adjacent the N type silicon island 12 (FIG. 9). Impurities from the layers 90 and 92 are thermally driven into source and drain areas of silicon islands 14 and 12 at a temperature of 950° C for one hour to form source and drain regions 78, 80 and 82, 84, respectively.

It is critical to the present novel process that the boron and phosphorus diffusions of the source and drain regions occur at a temperature significantly below the temperature at which the aluminum oxide layer is formed. This criticality is prefaced by the fact that these thermal diffusions very much resemble an annealing step and to make the diffusions at a temperature greater than the growth temperature of the aluminum oxide would result in the composite, comprising silicon islands adjacent the sapphire substrate with the aluminum oxide gate insulator thereon and contacted by the polycrystalline contact, exhibiting significant hysteresis in the capacitance-voltage plot for said composite.

Diffusion of boron, for example, from the layer 92 forms a source 94 and a drain 96 of a device 98 with a channel region 118 therebetween. Diffusion of phosphorus, for example, from the layer 90 forms a source 100 and a drain 102 for a device 104 with a channel region 126 therebetween.

Figure 10:
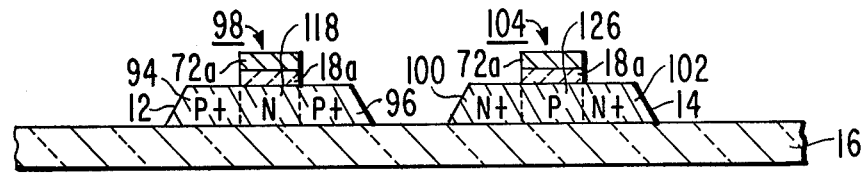

The devices 98 and 104 are stripped of the doped oxide layers 92 and 90 with a first solution of 10% hydrofluoric acid in water at a temperature of 23° C by immersion for a period of 3 minutes and with a second solution of 90% nitric acid at 95° C for about 30 minutes and then a repeat immersion for three minutes in the first solution. The resultant structure is shown in FIG. 10 wherein there is shown a P channel device 98 and an N channel device 104.

Next, a sealing oxide is typically placed adjacent the surface of the oxidizable surfaces of the transistors 98 and 104. This may be accomplished by exposing the wafer shown in FIG. 10 to a steam ambient at 875° C for approximately 20 minutes, for example. Silicon dioxide is thereby formed adjacent the polycrystalline silicon portion 72a and the silicon islands 12 and 14. Shown in FIG. 11 is a steam-grown silicon dioxide layer 106 adjacent the respective devices 98 and 104.

Figure 11:
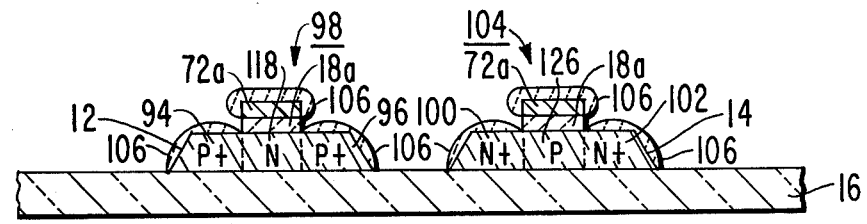
Figure 12:
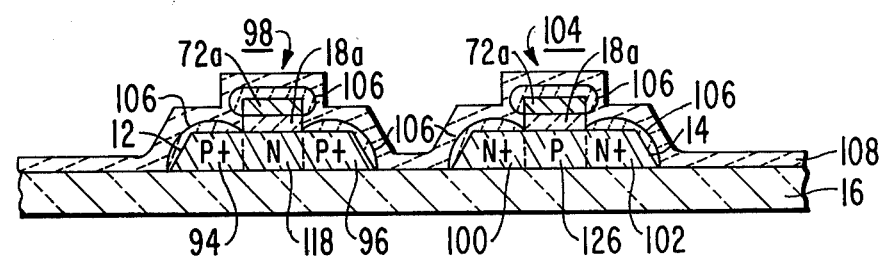

Next, an undoped silicon dioxide layer 108 is deposited adjacent the entire structure shown in FIG. 11 by a subsequent known process for decomposition of silane, as shown in FIG. 12. This silicon dioxide layer 108 serves as a crossover insulator into which contact windows are then etched. The silicon dioxide layer 108 adjacent the steam-grown oxide layers 106 may be etched by conventional photoresist and etching techniques using buffered hydrofluoric acid at 23° C.

Subsequent to the deposition of the silicon oxide layer 108 and the etching of the contact windows, the critical process step is performed. This critical process step is the sintering or annealing of the entire wafer as illustrated in FIG. 12 in a hydrogen atmosphere below the growth temperature of the $Al_2O_3$ portions 18a. In this example this critical anneal step is performed at 950° C for approximately 20 minutes. In the prior art this step has been routinely performed either at the growth temperature for the aluminum oxide or at a temperature higher than the growth temperature for the aluminum oxide.

Further, to provide enhancement type P channel silicon-on-sapphire transistors with threshold voltages in the −0.5 volt at −2 volt range, it is absolutely essential that before the formation of the silicon dioxide layer 108 as disclosed herein in FIG. 12, negative charges (not illustrated) at the interface between the portions 18a and the silicon islands 12 and 14, be removed.

Specifically, the inventors have discovered that this negative charge may be removed either by annealing the devices 98 and 104 shown in FIG. 11 at a temperature higher than the growth temperature of the aluminum oxide as well as at a temperature lower than or equal to the growth temperature of the aluminum oxide portions 18a. Another new discovery indicates a critical difference in the discovery above. Namely, a distinct advantage and utility arises when the devices 98 and 104 depicted in FIG. 11 are annealed and subjected to processing steps, subsequent to the growth of aluminum oxide portions 18a, at temperatures less than the growth temperature for the portions 18a.

Figure 13:
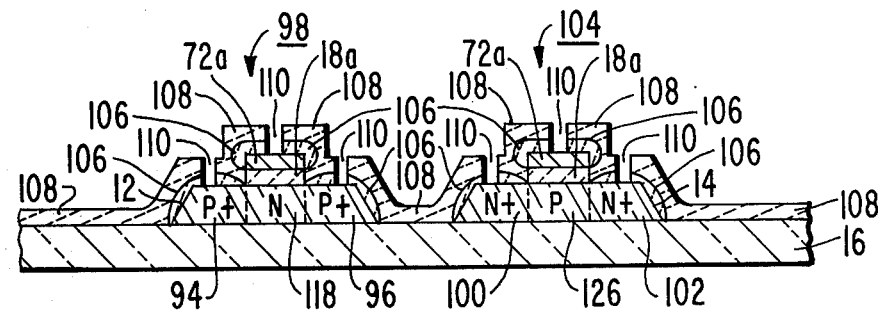
Figure 14:
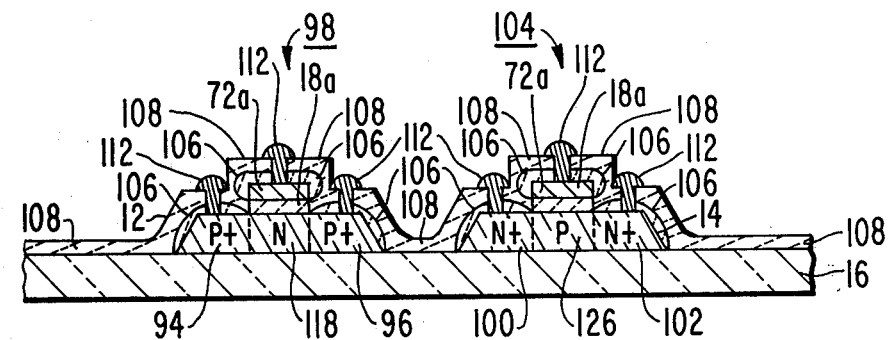

Shown in FIG. 13 is the resultant structure after contact windows 110 are formed therein for subsequent deposition of metal contacts. A layer of aluminum, for example, may now be deposited over the entire structure shown in FIG. 13 and selectively etched to form contacts 112 as shown in FIG. 14.

EXAMPLE I

Figure 15:
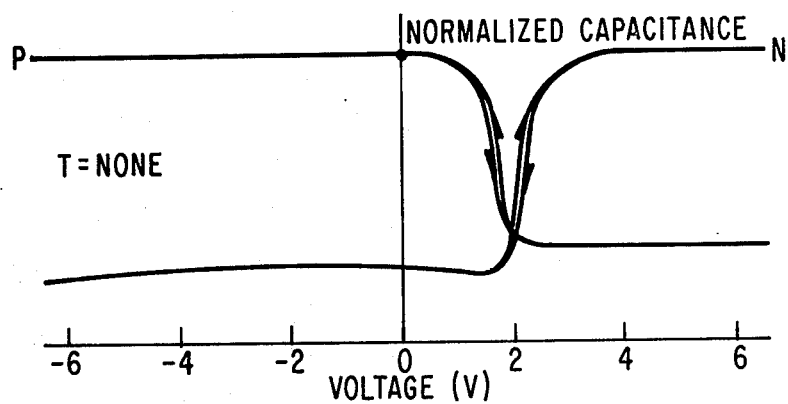
FIGS. 15–18 are capacitance-voltage plots of a polycrystalline silicon-aluminum oxide insulator-silicon composite comprising the transistor of the invention at selected annealing temperatures.

Shown in FIG. 15 is a capacitance-voltage plot of the normalized capacitance of N and P type silicon structures resembling the structures 98 and 104, respectively, as shown in FIG. 12. The capacitance-voltage curve shown was taken by removing the silicon dioxide layers 108 and 106. This sample was not subjected to the critical anneal step of the present novel process as specified herein. Mercury probes were placed adjacent the aluminum oxide portion 72. The hysteresis exhibited at 95% of total capacitance was less than one-tenth of one volt.

EXAMPLE II

Figure 16:
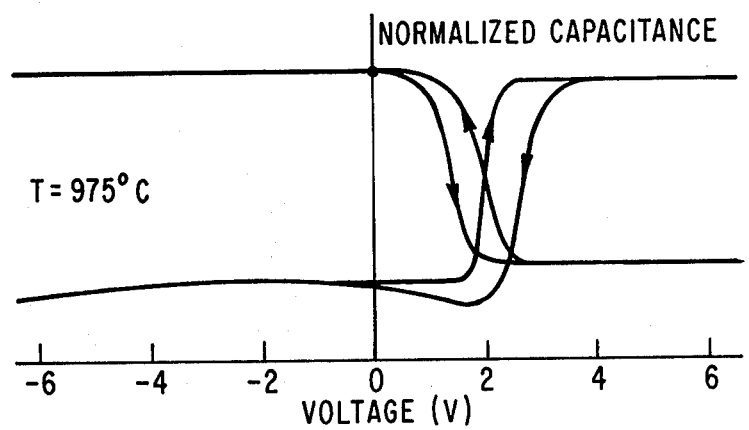

N and P samples of silicon similar to the silicon devices 98 and 104, respectively, as shown in FIG. 11 had the aluminum oxide portions 18a deposited at 975° C. The polycrystalline portions 72a were deposited adjacent the aluminum oxide portions 18a at a temperature of 720° C. Source and drain diffusion for both devices was performed at 1050° C for one hour. The devices were subsequently annealed in helium at 975° C for one hour. The capacitance-voltage plot as shown in FIG. 16 for this example indicates at 95% capacitance an instability in the threshold of the N type silicon device ranging from approximately 2.2 to 3.0 volts or a difference of approximately 0.8 volt. A similar, but lesser variation, is shown to occur for the P type silicon device wherein significant hysteresis is also shown. Capacitance-voltage plots for these N and P silicon structures taken with the polycrystalline contact to the aluminum oxide removed, also indicated significant hysteresis, thus substantiating that presence of the polycrystalline is not critical to the hysteresis.

EXAMPLE III

Figure 17:
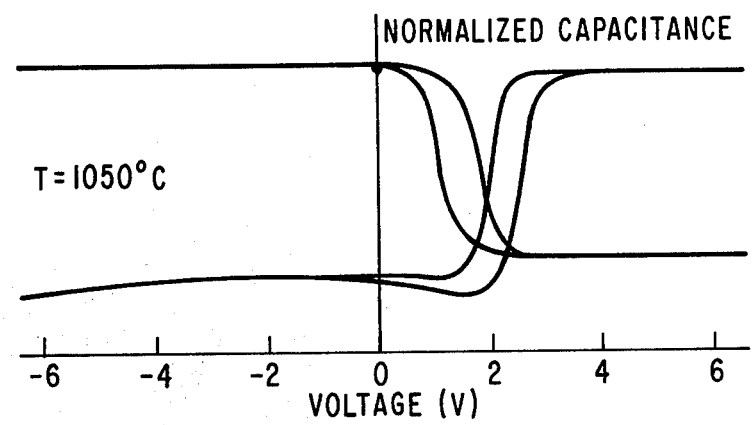

N and P type silicon structures similar to the transistors 98 and 104, respectively, shown in FIG. 12, were annealed at 1050° C for approximately 20 minutes and a significant hysteresis as shown in FIG. 17 was exhibited by the normalized capacitance-voltage plots. Actual differences at 95% of normalized capacitance for the gate voltages were at least 0.6 volts for both the P and N type structures.

EXAMPLE IV

Figure 18:
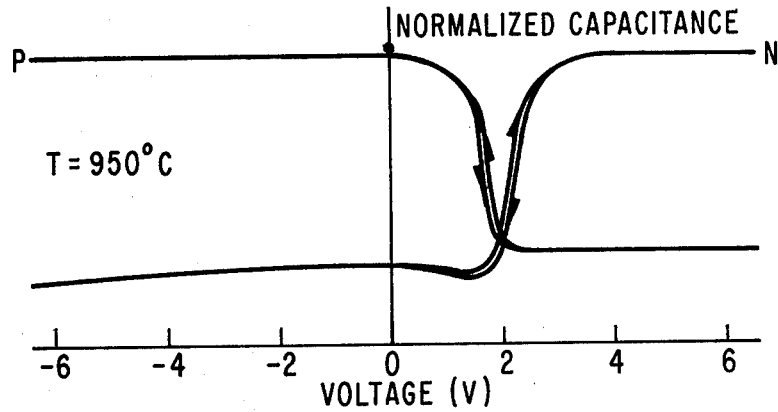

In FIG. 18 is shown a capacitance-voltage plot for both an N type and a P type structure resembling the transistors 98 and 104 as shown in FIG. 12. Contact windows were formed such that contacts are placed adjacent the polycrystalline contacting the aluminum oxide to provide this capacitance-voltage plot. The structures were annealed at 950° C for approximately 20 minutes. No significant hysteresis was shown. Hysteresis exhibited was less than one-tenth of 1 volt.

The novel transistor 98 and the novel transistor 104, as produced by the aforedescribed method, are shown completed in FIG. 14. The silicon island 12 of the transistor 98 has source and drain regions 94 and 96, separated by a channel region 118. The polycrystalline gate 72a is spaced above the channel 118 by a gate oxide comprised of aluminum oxide. The device is formed adjacent the substrate 16 and is completely protected by layers 106 and 108 which have windows 110 formed therein and adapted to receive the conductive metal contacts 112 to the source and drain regions 94 and 96.

The novel P channel device 98 as produced by the aforementioned process exhibits an improved capacitance-voltage characteristic and a stable threshold voltage similar to that shown in FIG. 18.

The novel N channel transistor 104 is made of a P silicon island 14 formed adjacent the sapphire substrate 16 and has source and drain regions 100 and 102 doped N+, and separated by a channel region 126. Adjacent the channel region 126 is the aluminum oxide portion 18a supporting a polycrystalline portion 72a. The transistor 104 is protected by silicon dioxide layers 106 and 108 formed adjacent thereto. The N channel device 104 exhibits an improved capacitance-voltage characteristic similar to the capacitance-voltage characteristic marked P as shown in FIG. 17 when produced in accordance with the novel method using the critical processing steps as aforedescribed.

We claim:

1. A method of making an improved complementary field effect transistor pair comprising the steps of:
    (a) forming a pair of laterally spaced semiconductor islands of N type and P type conductivity adjacent an insulating substrate;
    (b) coating the islands with an aluminum oxide layer at a first known temperature;
    (c) coating the aluminum oxide layer with a polycrystalline silicon layer;
    (d) coating the polycrystalline silicon layer with a doped oxide;
    (e) heating the coated polycrystalline silicon layer at a second temperature less than said first temperature for a preselected period to drive the dopant from the doped oxide into the polycrystalline silicon layer;
    (f) removing the doped oxide;
    (g) depositing an undoped oxide adjacent the polycrystalline silicon layer;
    (h) defining said undoped oxide into a mask for gates;
    (i) removing portions of the polycrystalline silicon layer and the aluminum oxide layer uncovered by the masks;
    (j) forming a layer of N-doped oxide adjacent the P type island;
    (k) forming another layer of P-doped oxide adjacent the N type island;
    (l) heat treating both islands simultaneously at a third temperature no greater than said second temperature for a predetermined period;
    (m) removing all oxides;
    (n) oxidizing the wafer at a fourth temperature less than said third temperature for an oxidation period; and
    (o) annealing the islands in hydrogen at a fifth temperature less than said first temperature.

2. A method according to claim 1, wherein the first temperature is no greater than 975° C.

3. A method according to claim 2, wherein said third temperature is no greater than 950° C and the oxidation period is about 20 minutes.

4. A method according to claim 1, wherein in step (l) the islands undergo said heat treating for about one hour.

5. A method according to claim 1, wherein in step (o) the islands are annealed for approximately 20 minutes.

6. A method according to claim 5, in which said aluminum oxide layer is deposited pyrohydrolytically.

7. A method according to claim 6, wherein the aluminum oxide layer is deposited at a growth rate of about 50 to 125 Å per minute.

8. A method according to claim 7, wherein the aluminum oxide layer is next slow-cooled in said hydrogen until the temperature of the islands decreases to about 300° to 400° C.

9. A method according to claim 8, in which said slow cooling is at a rate of 20° to 25° C per minute.

10. In a method of manufacturing a complementary field effect transistor pair produced by a silicon-on-insulator process comprising the steps of:
    forming a pair of laterally spaced semmiconductor islands of N-type and P-type conductivity adjacent an insulating substrate;
    coating the islands with an aluminum oxide layer at a first temperature;
    coating the aluminum oxide layer with a polycrystalline silicon layer;
    the improvement comprising the steps of:
    coating the polycrystalline silicon layer with doped glass and heating at a second temperature less than said first temperature, for a preselected period to drive the dopant into the polycrystalline silicon layer;
    removing the doped glass;
    depositing an undoped glass adjacent the polycrystalline silicon layer;
    defining said undoped glass into a mask for gates;
    removing portions of the polycrystalline silicon layer and the aluminum oxide layer not covered by the mask;
    forming a layer of N-doped glass adjacent the P-type island;
    forming a layer of P-doped glass adjacent the N-type island;
    heat treating both islands simultaneously at a third temperature no greater than said second temperature for a predetermined period;
    removing all glasses;
    oxidizing the wafer in a steam ambient at a fourth temperature less than said third temperature for an oxidation period; and
    annealing the islands in hydrogen at a fifth temperature less than said first temperature.

* * * * *